(12) United States Patent
Aoki et al.

(10) Patent No.: US 7,759,788 B2
(45) Date of Patent: Jul. 20, 2010

(54) SEMICONDUCTOR DEVICE

(75) Inventors: Tomoyuki Aoki, Tochigi (JP); Takuya Tsurume, Atsugi (JP); Hiroki Adachi, Tochigi (JP); Hisashi Ohtani, Tochigi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 130 days.

(21) Appl. No.: 12/230,484

(22) Filed: Aug. 29, 2008

(65) Prior Publication Data
US 2009/0057875 A1 Mar. 5, 2009

(30) Foreign Application Priority Data
Aug. 30, 2007 (JP) ............................. 2007-223342

(51) Int. Cl.
*H01L 23/14* (2006.01)
(52) U.S. Cl. ............................... 257/702; 257/E23.007
(58) Field of Classification Search ................. 257/702, 257/E23.007
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,072,345 A | 6/2000 | Ooishi | |
| 6,118,502 A | 9/2000 | Yamazaki et al. | |
| 6,223,990 B1 | 5/2001 | Kamei | |
| 6,224,965 B1 | 5/2001 | Haas et al. | |
| 6,376,333 B1 | 4/2002 | Yamazaki et al. | |
| 6,403,221 B1 | 6/2002 | Nakamura et al. | |
| 6,414,318 B1 | 7/2002 | Uber, III et al. | |
| 6,509,217 B1 | 1/2003 | Reddy | |
| 6,525,595 B2 | 2/2003 | Oku | |
| 6,737,302 B2 | 5/2004 | Arao | |
| 6,809,498 B2 | 10/2004 | Nakamura et al. | |
| 6,960,955 B2 | 11/2005 | Nonaka | |
| 6,963,269 B2 | 11/2005 | Saitoh et al. | |

(Continued)

FOREIGN PATENT DOCUMENTS

EP    1092739    4/2001

(Continued)

*Primary Examiner*—David S Blum
(74) *Attorney, Agent, or Firm*—Eric J. Robinson; Robinson Intellectual Property Law Office, P.C.

(57) ABSTRACT

A highly reliable semiconductor device which is not damaged by local pressing force from the outside and in which unevenness of a portion where an antenna and an element overlap with each other is reduced. The semiconductor device includes a chip and an antenna. The chip includes a semiconductor element layer including a thin film transistor; a conductive resin electrically connected to the semiconductor element layer; and a sealing layer. The sealing layer in which a fiber body is impregnated with an organic resin covers the semiconductor element layer and the conductive resin, and has a thickness of 10 to 100 μm. The antenna has a depressed portion and is electrically connected to the semiconductor element layer through the conductive resin. The chip is embedded inside the depressed portion. The thickness of the chip is equal to the depth of the depressed portion.

22 Claims, 11 Drawing Sheets

U.S. PATENT DOCUMENTS

| | | |
|---|---|---|
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |
| 2001/0019511 A1 | 9/2001 | Kondo et al. |
| 2002/0049714 A1 | 4/2002 | Yamazaki et al. |
| 2003/0032210 A1 | 2/2003 | Takayama et al. |
| 2003/0071953 A1 | 4/2003 | Yamazaki et al. |
| 2003/0121985 A1 | 7/2003 | Baldischweiler et al. |
| 2004/0001453 A1 | 1/2004 | Kawai et al. |
| 2004/0102176 A1 | 5/2004 | Hayashi et al. |
| 2004/0128246 A1 | 7/2004 | Takayama et al. |
| 2004/0145454 A1 | 7/2004 | Powell et al. |
| 2005/0046464 A1 | 3/2005 | Kobayashi et al. |
| 2005/0070038 A1 | 3/2005 | Yamazaki et al. |
| 2005/0130389 A1 | 6/2005 | Yamazaki et al. |
| 2005/0133605 A1 | 6/2005 | Koyama et al. |
| 2005/0162131 A1 | 7/2005 | Sennami et al. |
| 2005/0162578 A1 | 7/2005 | Yamazaki et al. |
| 2005/0215119 A1 | 9/2005 | Kaneko |
| 2005/0233122 A1 | 10/2005 | Nishimura et al. |
| 2005/0254183 A1 | 11/2005 | Ishida et al. |
| 2006/0009251 A1 | 1/2006 | Noda et al. |
| 2006/0046037 A1* | 3/2006 | Friend et al. ............... 428/212 |
| 2007/0229279 A1 | 10/2007 | Yamazaki et al. |
| 2007/0229281 A1 | 10/2007 | Shionoiri et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0093934 A1 | 4/2008 | Kato |
| 2008/0093935 A1 | 4/2008 | Saito et al. |

FOREIGN PATENT DOCUMENTS

| | | |
|---|---|---|
| EP | 1589797 | 10/2005 |
| JP | 05-190582 | 7/1993 |
| JP | 06-150652 | 5/1994 |
| JP | 10-092980 | 4/1998 |
| JP | 10-307898 | 11/1998 |
| JP | 11-196540 | 7/1999 |
| JP | 2002-231545 | 8/2002 |
| JP | 2003-006592 | 1/2003 |
| JP | 2003-070187 | 3/2003 |
| JP | 2003-123033 | 4/2003 |
| JP | 2003-218624 | 7/2003 |
| JP | 2003-299255 | 10/2003 |
| JP | 2003-348773 | 12/2003 |
| JP | 2004-078991 | 3/2004 |
| JP | 2004-343410 | 12/2004 |
| JP | 2004-362341 | 12/2004 |
| JP | 2005-210843 | 8/2005 |
| JP | 2005-229098 | 8/2005 |
| JP | 2005-252853 | 9/2005 |
| JP | 2005-316724 | 11/2005 |
| JP | 2005-321911 | 11/2005 |
| JP | 2005-352434 | 12/2005 |
| JP | 2006-004015 | 1/2006 |
| JP | 2006-180073 | 7/2006 |
| JP | 2006-203852 | 8/2006 |
| JP | 2006-293690 | 10/2006 |
| WO | WO 01/01740 | 1/2001 |
| WO | WO 04/001848 | 12/2003 |

* cited by examiner

SEMICONDUCTOR DEVICE

BACKGROUND OF THE INVENTION

1. Field of the Invention

The present invention relates to a semiconductor device and a manufacturing method thereof.

2. Description of the Related Art

Currently, it is important to make a variety of devices such as wireless chips and sensors into a thinner shape in miniaturizing products, and the techniques and the application range spread rapidly. Since such a variety of devices which are made thin are flexible to some extent, the devices can be mounted on an object having a curved surface.

A technique of manufacturing a semiconductor device is proposed, in which an element layer including a thin film transistor, which is formed on a glass substrate, is separated from the substrate and transferred to another base material, for example, a plastic film or the like.

For example, Patent Document 1 (Japanese Published Patent Application No. 2004-78991) discloses a semiconductor device in which a semiconductor chip with a size of 0.5 mm or less is embedded in paper or a film-like medium, whereby resistance to bending and concentrated load is improved.

SUMMARY OF THE INVENTION

However, in the case of a semiconductor device with a built-in (on-chip) antenna which is incorporated in a chip, the size of the antenna is small, and thus, a communication range is reduced. Further, in the case where a semiconductor device is manufactured by connecting an antenna provided for paper or a film medium to a chip, poor connection occurs when the size of the chip is small.

Accordingly, it is preferable that the size of a chip itself be made larger in order to prevent poor connection or reduction in communication range. However, when the area of the chip is enlarged, a semiconductor device which is transferred to a plastic film or the like is cracked by local pressing force from the outside, resulting in an operation defect.

For example, when a character is written with a writing material on a plastic sheet or paper on a surface of a semiconductor device, writing pressure is applied to the semiconductor device, leading to a problem of destruction of the semiconductor device.

Further, in a conventional semiconductor device in which an antenna is incorporated in a chip, the total thickness of the semiconductor device is thick. Moreover, the thickness of a portion where the built-in antenna and a semiconductor element such as a transistor overlap with each other is thick, so that unevenness is generated on a surface of the semiconductor device.

In view of the foregoing problems, objects of the present invention are to manufacture a highly reliable semiconductor device, which is not damaged by local pressing force from the outside, with high yield and to reduce unevenness of a portion where an antenna and an element overlap with each other.

In the present invention, a fiber body of an organic compound or an inorganic compound which is impregnated with an organic resin is provided over a semiconductor element layer and is subjected to thermocompression bonding, whereby a semiconductor device to which the semiconductor element layer and a sealing layer in which the fiber body of the organic compound or the inorganic compound is impregnated with the organic resin are fixed is manufactured.

In addition, in the present invention, a depressed portion is formed in a region of an antenna, which is to be connected to a semiconductor element, and the semiconductor element is embedded in the depressed portion, whereby unevenness of a surface of the semiconductor device is reduced.

The present invention relates to semiconductor devices described below.

One aspect of the present invention is a semiconductor device including a chip and an antenna. The chip includes a semiconductor element layer including a thin film transistor; a conductive resin electrically connected to the semiconductor element layer; and a sealing layer. The sealing layer in which a fiber body is impregnated with an organic resin covers the semiconductor element layer and the conductive resin, and has a thickness of 10 to 100 μm. The antenna has a depressed portion and is electrically connected to the semiconductor element layer through the conductive resin. The chip is embedded inside the depressed portion. The thickness of the chip is equal to the depth of the depressed portion. The thickness of the chip may be equal to or smaller than the depth of the depressed portion.

Another aspect of the present invention is a semiconductor device including a chip, an antenna, and a substrate. The chip includes a semiconductor element layer including a thin film transistor; a conductive resin electrically connected to the semiconductor element layer; and a sealing layer. The sealing layer in which a fiber body is impregnated with an organic resin covers the semiconductor element layer and the conductive resin, and has a thickness of 10 to 100 μm. The antenna has a depressed portion and is electrically connected to the semiconductor element layer through the conductive resin. The substrate is provided to cover the chip and the antenna. The chip is embedded inside the depressed portion. The thickness of the chip is ⅔ to ⅘ times the thickness of the substrate.

In the present invention, in the fiber body, the warp yarns and the weft yarns in each of which a plurality of single yarns of an organic compound or an inorganic compound are bundled may be closely woven.

In the present invention, the fiber body may be a woven fabric or a nonwoven fabric.

In the present invention, the fiber body may include a polyvinyl alcohol fiber, a polyester fiber, a polyamide fiber, a polyethylene fiber, an aramid fiber, a polyparaphenylene benzobisoxazole fiber, a glass fiber, or a carbon fiber.

In the present invention, the organic resin may include a thermosetting resin, a thermoplastic resin, or a UV curable resin.

In the present invention, the thermosetting resin may be an epoxy resin, an unsaturated polyester resin, a polyimide resin, a bismaleimide-triazine resin, or a cyanate resin.

In the present invention, the thermoplastic resin may be a polyphenylene oxide resin, a polyetherimide resin, or a fluorine resin.

In the present invention, the antenna may include at least one of silver (Ag), gold (Au), copper (Cu), nickel (Ni), platinum (Pt), palladium (Pd), tantalum (Ta), molybdenum (Mo), titanium (Ti), and aluminum (Al).

In the present invention, a structure body in which a fiber body of an organic compound or an inorganic compound is impregnated with an organic resin is used, whereby a highly reliable semiconductor device which is not easily damaged by local pressure from the outside can be manufactured with high yield.

In addition, since a planarized semiconductor device can be obtained according to the present invention, creases are prevented from occurring in the structure body in which the fiber body of the organic compound or the inorganic compound is impregnated with the organic resin.

Further, when a protective material such as a film is attached to a surface of a completed semiconductor device, the semiconductor device has to be passed over a roller. When passing over the roller in such a manner, the semiconductor device might be destroyed by application of linear pressure. However, the semiconductor device with little unevenness can smoothly pass over the roller, and destruction of the semiconductor device can be prevented.

DETAILED DESCRIPTION OF THE INVENTION

Figure 1A:
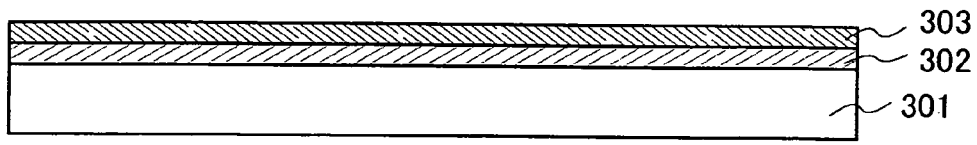
FIGS. 1A to 1E are cross-sectional views illustrating a method of manufacturing a semiconductor device of the present invention.

Hereinafter, embodiment modes of the present invention will be described with reference to drawings. Note that the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in the drawings described below, the same portions or portions having similar functions are denoted by the same reference numerals, and the description thereof will not be repeated.

Embodiment Mode 1

This embodiment is described with reference to FIGS. 1A to 1E, FIGS. 2A to 2F, FIGS. 3A to 3D, FIGS. 4A and 4B, FIGS. 5A to 5D, and FIG. 6.

First, a separation layer 302 is formed over a substrate 301, and then, a semiconductor element layer 303 is formed (see FIG. 1A).

As the substrate 301, a glass substrate, a quartz substrate, a ceramic substrate, a metal substrate in which an insulating layer is formed on at least one surface, an organic resin substrate, or the like can be used. In this embodiment mode, a glass substrate is used as the glass substrate 301.

The separation layer 302 is formed having a single-layer structure or a stacked-layer structure of a layer with a thickness of 30 to 200 nm, which is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the above elements as its main component by a sputtering method, a plasma CVD method, a coating method, a printing method, or the like. A crystalline structure of a layer containing silicon may be amorphous, microcrystalline, or polycrystalline. Note that in this embodiment mode, a coating method refers to a method in which a solution is discharged on an object to form a film, and includes, for example, a spin coating method and a droplet discharging method in its category. Further, a droplet discharging method refers to a method in which droplets of a composition containing fine particles are discharged through a minute hole to form a pattern with a predetermined shape.

When the separation layer 302 has a single-layer structure, it is preferable to form a layer containing tungsten, molybdenum, or a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum is formed. Note that a mixture of tungsten and molybdenum corresponds to an alloy of tungsten and molybdenum, for example.

When the separation layer 302 has a stacked-layer structure, it is preferable to form a metal layer as a first layer and a metal oxide layer as a second layer. Typically, as the first-layer metal layer, a layer containing tungsten, molybdenum, or a mixture of tungsten and molybdenum is formed. As the second layer, a layer containing oxide of tungsten, molybdenum, or a mixture of tungsten and molybdenum; a layer containing nitride of tungsten, molybdenum, or a mixture of tungsten and molybdenum; a layer containing oxynitride of tungsten, molybdenum, or a mixture of tungsten and molybdenum; or a layer containing nitride oxide of tungsten, molybdenum, or a mixture of tungsten and molybdenum is formed.

When the separation layer 302 has a stacked-layer structure in which a metal layer is formed as the first layer and a metal oxide layer is formed as the second layer, the stacked-layer structure may be formed as follows: a layer containing tungsten is formed as the metal layer, and an insulating layer made of oxide is formed thereover, whereby a layer containing oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability, such as ozone water, or the like.

Examples of oxide of tungsten include $WO_2$, $W_2O_5$, $W_4O_{11}$, and $WO_3$.

Although the separation layer 302 is formed so as to be in contact with the substrate 301 in the above step, the present invention is not limited to this step. An insulating layer to serve as a base may be formed so as to be in contact with the substrate 301, and the separation layer 302 may be formed so as to be in contact with the insulating layer. In this embodiment mode, as the separation layer 302, a tungsten layer with a thickness of 30 to 70 nm is formed by a sputtering method.

The thickness of the semiconductor element layer 303 is preferably 1 to 10 μm, more preferably 1 to 5 μm. When the semiconductor element layer 303 has such a thickness, a semiconductor device capable of being bent can be formed. Moreover, the area of a top surface of the semiconductor device is preferably 4 mm$^2$ or more, more preferably 9 mm$^2$ or more.

As an example of the semiconductor element layer 303, an element layer 51 including thin film transistors 52a and 52b over an insulating layer 56 is shown.

The thin film transistors 52a includes a semiconductor layer 53a including a source region, a drain region, and a channel region, a gate insulating layer 54, and a gate electrode 55a. The thin film transistor 52b includes a semiconductor layer 53b including a source region, a drain region, and a channel region, the gate insulating layer 54, and a gate electrode 55b.

Interlayer insulating films 41 and 42 are formed to cover the thin film transistors 52a and 52b. Moreover, wirings 57a and 58a which are in contact with the source and drain regions in the semiconductor layer 53a, and wirings 57b and 58b which are in contact with the source and drain regions in the semiconductor layer 53b are formed over the interlayer insulating film 42. Further, an interlayer insulating film 43 is formed.

A typical example of a semiconductor device including such an element layer 51 is a microprocessor (MPU) which controls another device or performs calculation and processing of data. An MPU includes a CPU, a main memory, a controller, an interface, an I/O port, or the like, each of which can include a thin film transistor, a resistor, a capacitor, a wiring, or the like.

Figure 3A:
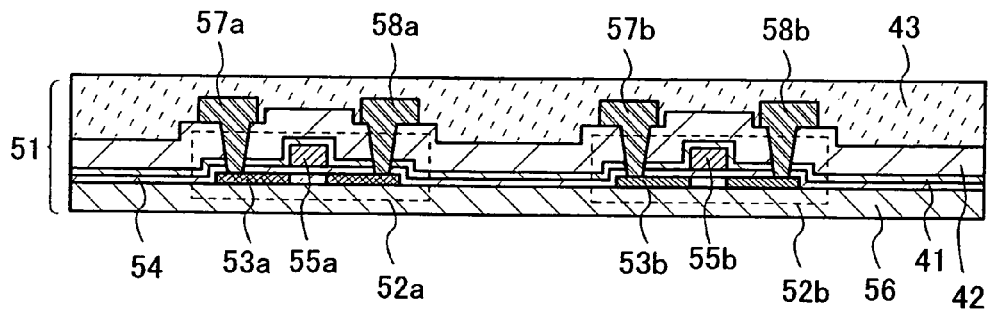
FIGS. 3A to 3D are cross-sectional views each illustrating a method of manufacturing a semiconductor device of the present invention.
Figure 3B:
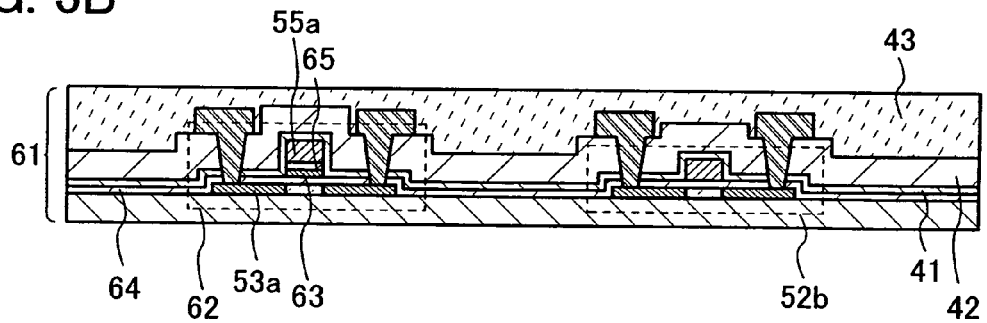

When an element layer 61 including a memory element 62 and the thin film transistor 52b shown in FIG. 3B is formed as the semiconductor element layer 303, a memory device can be manufactured as the semiconductor device.

Examples of the memory element 62 include a nonvolatile memory element including a floating gate or a charge accumulation layer; a thin film transistor and a capacitor which is connected to the thin film transistor; a thin film transistor and a capacitor which is connected to the thin film transistor and includes a ferroelectric layer; and an organic memory element in which an organic compound layer is interposed between a pair of electrodes.

The memory element 62 shown in FIG. 3B is a nonvolatile memory element including the semiconductor layer 53a, a tunnel insulating layer 64, a floating gate electrode 63, a control insulating layer 65, and the control gate electrode 55a.

Examples of a semiconductor device including such an element layer 61 include memory devices such as a DRAM (dynamic random access memory), an SRAM (static random access memory), a FeRAM (ferroelectric random access memory), a mask ROM (read only memory), an EPROM (electrically programmable read only memory), an EEPROM (electrically erasable and programmable read only memory), and a flash memory.

Figure 3C:
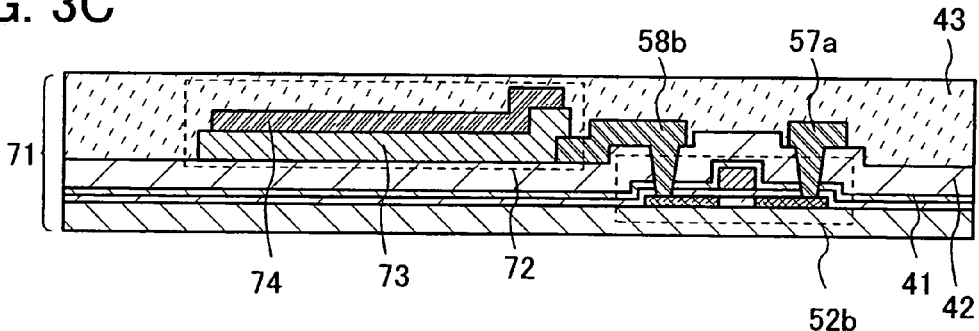

FIG. 3C illustrates an example in which an element layer 71 including a diode 72 and the thin film transistor 52b is formed as the semiconductor element layer 303.

The diode 72 shown in FIG. 3C includes the wiring 58b functioning as a first electrode, a light receiving portion 73, and a second electrode 74. The light receiving portion can be formed using a semiconductor layer containing amorphous or crystalline silicon. Typical examples of such a semiconductor layer include a silicon layer, a silicon germanium layer, or a silicon carbide layer; or a PN junction layer or a PIN junction layer of the above.

As a semiconductor device including such an element layer 71, an optical sensor, an image sensor, a solar battery, or the like can be manufactured. Examples of the diode 72 include a PN diode, a PIN diode, an avalanche diode, a Schottky diode, or the like in which amorphous silicon or polysilicon is used.

Figure 3D:
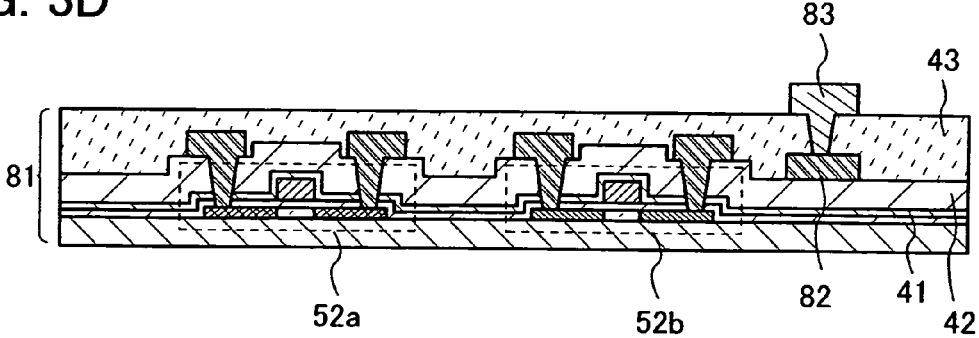

When an element layer 81 including the thin film transistors 52a and 52b, wirings 82 connected to the source and drain regions of the semiconductor layer in the thin film transistors 52a and 52b, and an electrode 83 electrically connected to the wiring 82 is formed as the semiconductor element layer 303, an ID tag, an IC tag, an RF (radio frequency) tag, a wireless tag, an electronic tag, an RFID (radio frequency identification) tag, an IC card, an ID card, or the like which can wirelessly transmit and receive information (hereinafter referred to as RFID) can be manufactured as the semiconductor device (see FIG. 3D).

Figure 1B:
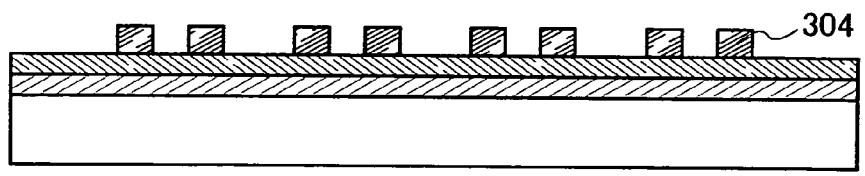

After the semiconductor element layer 303 is formed, a conductive resin 304 which is electrically connected to the wirings 57a, 57b, 58a, and 58b is formed over the semiconductor element layer 303 (see FIG. 1B). For the conductive resin 304, at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like; fine particles of silver halide; or dispersible nanoparticles can be used. In this embodiment mode, as the conductive resin 304, a resin containing silver is formed by a screen printing method and then hardened at 300° C. for 30 minutes in an air atmosphere.

Figure 1C:
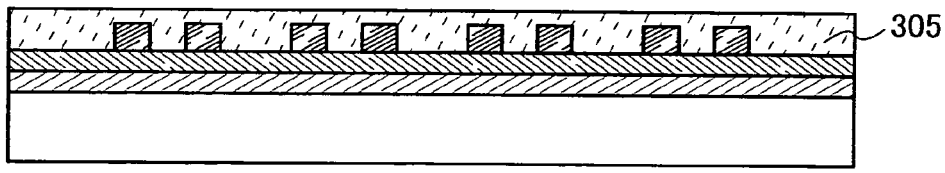

Next, a sealing layer 305 including a fiber body 113 and an organic resin layer 114 is formed over the semiconductor element layer 303 and the conductive resin 304 (see FIG. 1C).

The fiber body 113 is a woven fabric or a nonwoven fabric using a high-strength fiber of an organic compound or an inorganic compound. The high-strength fiber is specifically a fiber with a high tensile modulus of elasticity or a fiber with a high Young's modulus. Typical examples of the high-strength fiber include a polyvinyl alcohol fiber, a polyester fiber, a polyamide fiber, a polyethylene fiber, an aramid fiber, a polyparaphenylene benzobisoxazole fiber, a glass fiber, and a carbon fiber. As the glass fiber, a glass fiber using E glass, S glass, D glass, Q glass, or the like can be used. Note that the fiber body 113 may be formed from one kind or a plurality of the above-described high-strength fibers.

Alternatively, the fiber body 113 may be a woven fabric formed using bundles of fibers (single yarns) (hereinafter, the bundles of fibers are referred to as yarn bundles) for the warp yarn and the weft yarn, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a cross section of a circular shape or an elliptical shape. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A yarn bundle of fibers which is subjected to fiber opening has a large width, has a smaller number of single yarns in the thickness direction, and has a cross section of an elliptical shape or a flat shape. Further, when a loosely twisted yarn is used as the yarn bundle of fibers, the yarn bundle is easily flattened and has a cross section of an elliptical shape or a flat shape. By using a yarn bundle having a cross section of an elliptical shape or a flat shape as described above, it is possible to make the fiber body 113 thinner. Accordingly, the sealing layer 305 can be made thinner, and thus, a thin semiconductor device can be manufactured. Although the diameter of the yarn bundle is preferably 4 to 400 μm, more preferably 4 to 200 μm, it is theoretically possible that the diameter of the yarn bundle is even smaller. Moreover, although the thickness of the fiber is preferably 4 to 20 μm, it is theoretically possible that the thickness of the fiber is even smaller, and the thickness of the fiber depends on a material of the fiber.

Figure 4A:
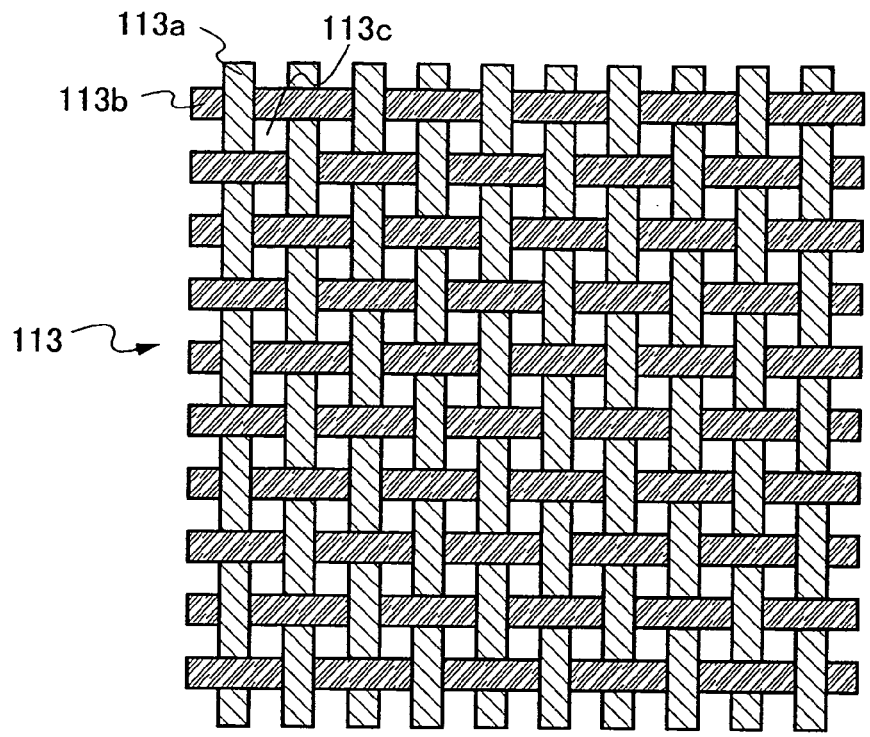
FIGS. 4A and 4B are top plan views each illustrating a fiber body of the present invention.
Figure 4B:
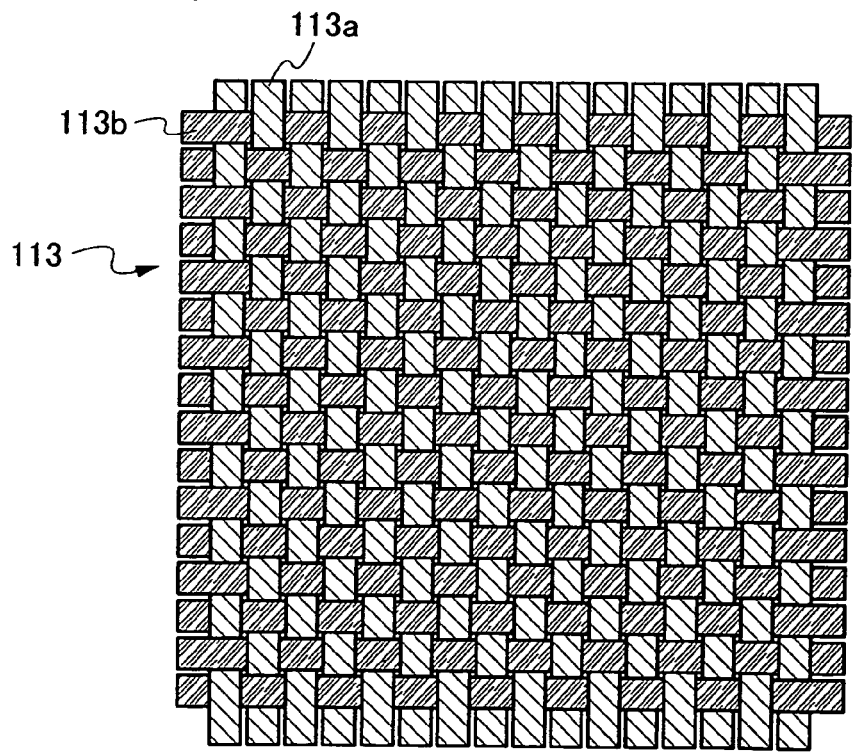

FIGS. 4A and 4B each are a top plan view of the fiber body 113 which is a woven fabric formed using yarn bundles of fibers for the warp yarn and the weft yarn.

As shown in FIG. 4A, the fiber body 113 is woven using warp yarns 113*a* spaced at regular intervals and weft yarns 113*b* spaced at regular intervals. Such a fiber body has regions without the warp yarns 113*a* and the weft yarns 113*b* (referred to as basket holes 113*c*). Such a fiber body 113 is further impregnated with an organic resin; thus, adhesion between the fiber body 113 and the element layer can be increased.

As shown in FIG. 4B, in the fiber body 113, the density of the warp yarns 113*a* and the weft yarns 113*b* may be high and the proportion of the basket holes 113*c* may be low. Typically, the size of the basket hole 113*c* is preferably smaller than the area of a locally pressed portion, and preferably has a rectangular shape having a side with a length of 0.01 to 0.2 mm. When the basket hole 113*c* in the fiber body 113 has such a small area, pressure can be absorbed by the entire fiber body 113 even if the fiber body 113 is pressed by a member with a sharp tip (typically, a writing material such as a pen or a pencil).

Further, in order to enhance permeability of an organic resin into the inside of the yarn bundle of fibers, the fiber may be subjected to surface treatment. Examples of the surface treatment include corona discharge, plasma discharge, and the like for activating a surface of the fiber as well as surface treatment using a silane coupling agent or a titanate coupling agent.

For the organic resin layer 114 which is impregnated into the fiber body 113 and seals a surface of the semiconductor element layer 303, a thermosetting resin such as an epoxy resin, an unsaturated polyester resin, a polyimide resin, a bismaleimide-triazine resin, or a cyanate resin; a thermoplastic resin such as a polyphenylene oxide resin, a polyetherimide resin, or a fluorine resin; a plurality of the above-described thermosetting resins and the thermoplastic resins; a UV curable resin; or an organic plastic resin can be used. By using the above-described organic resin, the fiber body 113 can be fixed to the semiconductor element layer 303 by heat treatment. Note that the higher the glass transition temperature of the organic resin layer 114 is, the less the organic resin layer 114 is damaged by local pressing force, which is preferable.

In addition, the thickness of the sealing layer 305 is preferably 10 to 100 μm, more preferably 10 to 30 μm. When the structure body having such a thickness is used, a thin semiconductor device capable of being bent can be formed.

Highly thermally conductive filler may be dispersed in the organic resin layer 114 or in the yarn bundles of fibers. Examples of the highly thermally conductive filler include aluminum nitride, boron nitride, silicon nitride, alumina, and metal particles of silver, copper, or the like. When the highly thermally conductive filler is included in the organic resin or in the yarn bundles of fibers, heat generated in the element layer can be easily released to the outside. Accordingly, thermal storage in the semiconductor device can be suppressed, and destruction of the semiconductor device can be reduced.

Figure 5A:
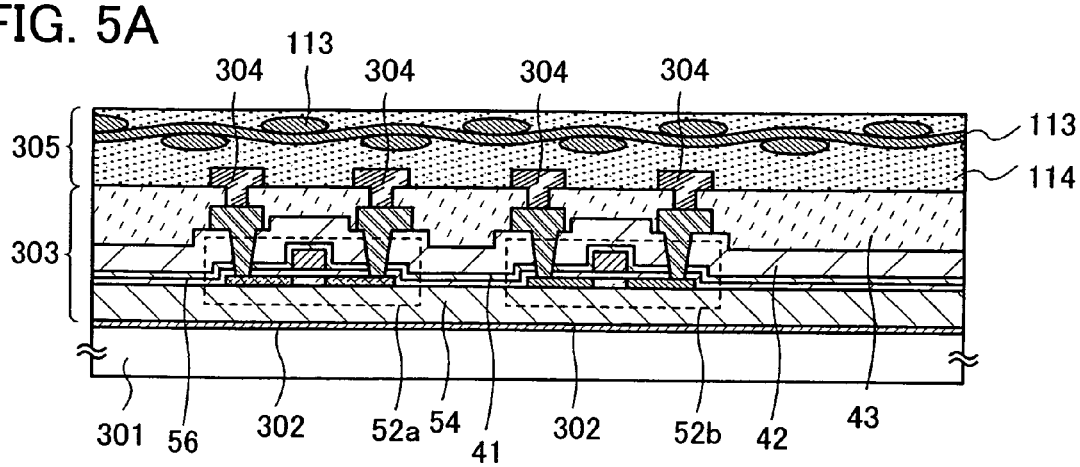
FIGS. 5A to 5D are cross-sectional views illustrating a method of manufacturing a semiconductor device of the present invention.

FIG. 5A is a cross-sectional view in the case where the element layer 51 shown in FIG. 3A is used as the semiconductor element layer 303. In FIG. 5A, the fiber body 113 is shown as a woven fabric which is plain-woven using yarn bundles each having a cross section of an elliptical shape. Moreover, the thin film transistors 52*a* and 52*b* are larger than the yarn bundles of the fiber body 113; however, the thin film transistors 52*a* and 52*b* may be smaller than the yarn bundles of the fiber body 113 in some cases.

Further, the conductive resin 304 is electrically connected to the wirings 57*a*, 57*b*, 58*a*, and 58*b*.

In this embodiment mode, in order to fix the sealing layer 305 to the semiconductor element layer 303, the sealing layer 305 is provided over the semiconductor element layer 303 and after that, a first press step and a second press step are performed.

First, the first press step (a vacuum press step) is performed in order to remove bubbles entering between the sealing layer 305 and the semiconductor element layer 303 and to temporarily fix the sealing layer 305. In this embodiment mode, the first press step is performed in such a manner that the temperature is raised from a room temperature to 100° C. in 30 minutes in a vacuum atmosphere.

Next, the second press step is performed in order to uniformly fix the sealing layer 305 to the semiconductor element layer 303. In the embodiment mode, as the second press step, the temperature is held at 135° C. under a pressure of 0.3 MPa for 15 minutes, and after that, the temperature is raised to 195° C. and held for 60 minutes.

Figure 1D:
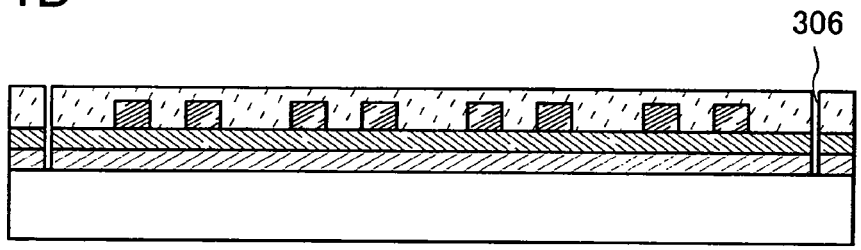

Next, as shown in FIG. 1D, grooves 306 are formed in the sealing layer 305, the semiconductor element layer 303, and the separation layer 302 by laser beam irradiation or cutting with an edged tool.

As a laser beam to be emitted to form the groove 306, it is preferable to use a laser beam having a wavelength which is absorbed by any of the separation layer 302, the semiconductor element layer 303, and the sealing layer 305. Typically, a laser beam in an ultraviolet region, a visible light region, or an infrared region is selected as appropriate to perform irradiation.

As a laser capable of emitting such a laser beam, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG, $GdVO_4$, $YVO_4$, YLF, or $YAlO_3$ which are doped with Cr, Nd, Er, Ho, Ce, Co, Ti, or Tm, a glass laser, or a ruby laser; or a semiconductor laser such as a GaN, GaAs, GaALAs, or InGaAsP laser. Note that a fundamental wave to a fifth harmonic are preferably used in a solid-state laser as appropriate.

When the groove 306 is formed with the edged tool, a cutter knife or the like may be used as the edged tool.

Figure 5B:
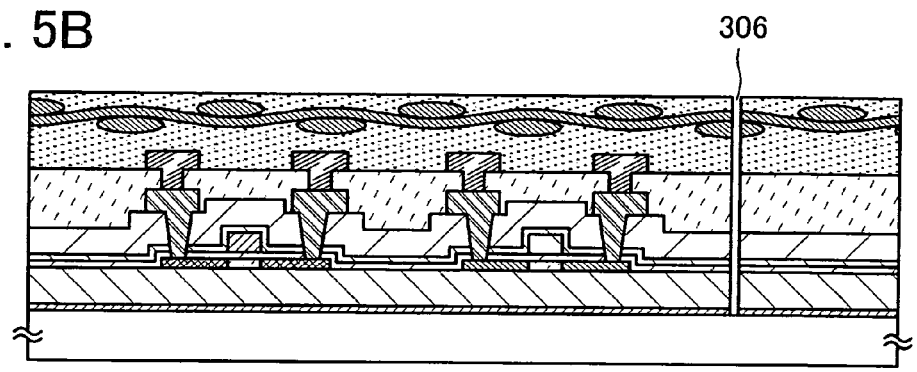

In this embodiment mode, the groove 306 is formed using a UV laser. FIG. 5B is a cross-sectional view in the case where the element layer 51 shown in FIG. 3A is used as the semiconductor element layer 303.

Figure 1E:
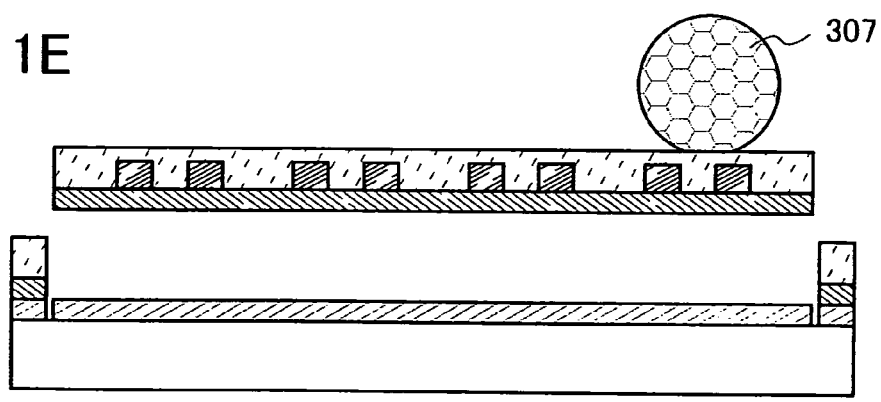

Next, as shown in FIG. 1E, a liquid is dropped into the grooves 306, and the separation layer 302 and the semiconductor element layer 303 are separated from each other by a physical means. The physical means refers to a dynamic means or a mechanical means, for example, a means for changing some dynamical energy (mechanical energy). Typically, the physical means is an action of applying mechanical force (e.g., a peeling process with human hands or with a gripper, or a separation process by rotating a roller). At this time, when an adhesive sheet which can be separated by light or heat is provided on a surface of the sealing layer 305, separation can be performed more easily. The adhesive sheet may be attached by a mechanical means or a human means. Note that when bubbles enter between the sealant sheet and the sealing layer 305, a defect might occur in transfer; therefore, bubbles should be prevented from entering.

In this embodiment mode, water, for example, pure water is used as the liquid, and a roller 307 is rotated over the sealing layer 305, whereby the semiconductor element layer 303, the conductive resin 304, and the sealing layer 305 are transferred to the roller 307 (see FIG. 1E).

As the liquid, alcohol such as ethanol, carbonated water, or the like may be used other than pure water. Moreover, in this embodiment mode, a rubber roller having a diameter of 300 mm is used as the roller 307.

Figure 2A:
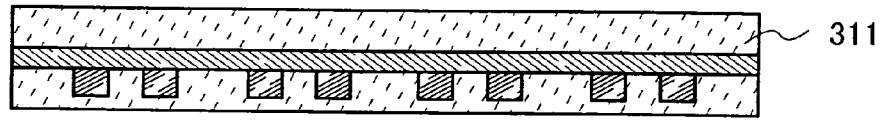
FIGS. 2A to 2F are cross-sectional views illustrating a method of manufacturing a semiconductor device of the present invention.
Figure 2B:
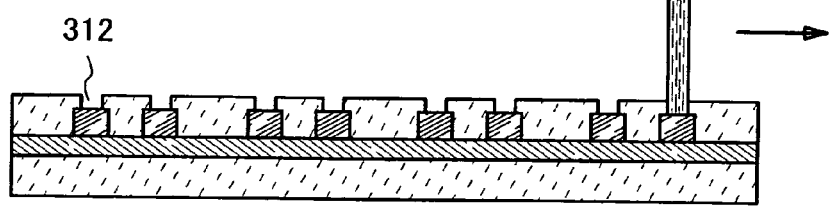
Figure 2C:
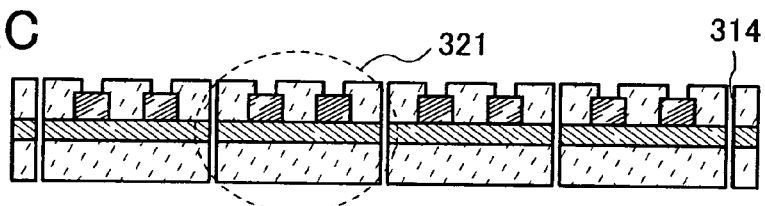
Figure 2D:
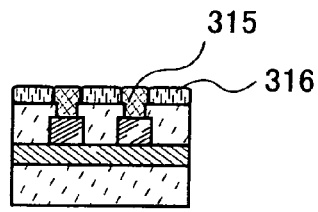

Next, a second sealing layer 311 is formed on a surface of the semiconductor element layer 303, which is not provided with the sealing layer 305, that is, a rear surface of the semiconductor element layer 303 (see FIG. 2A). The second sealing layer 311 may be formed in the same manner as the sealing layer 305.

When the separation layer 302 and the semiconductor element layer 303 are separated from each other by dropping the liquid into the grooves 306, static electricity generated in separation can be prevented, and damage to the semiconductor element layer 303 can be suppressed. Thus, operation yield is drastically improved.

Next, in order to realize electrical connection between the semiconductor element layer 303 and the outside, the sealing layer 305 over the conductive resin 304 is removed to form an opening portion 312. The sealing layer 305 is removed by being irradiated with a laser beam 313 (see FIG. 2B).

Typically, the laser beam 313 may be selected from a laser beam in an ultraviolet region, a visible light region, or an infrared region as appropriate.

As a laser capable of emitting such a laser beam 313, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG, $GdVO_4$, $YVO_4$, YLF, or $YAlO_3$ which are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that a fundamental wave to a fifth harmonic are preferably used in a solid-state laser as appropriate.

In this embodiment mode, the laser beam 313 of a YAG laser with a wavelength of 355 nm, and nine shots of laser irradiation with a slit size of 150 μm square are performed per one conductive resin 304, whereby the sealing layer 305 is removed, and the opening portion 312 is formed.

In this embodiment mode, since the sealing layer 305 over the region where the conductive resin 304 is formed is irradiated with the laser beam 313, the laser beam 313 is blocked by the conductive resin 304 and does not reach the semiconductor element layer 303. That is, the semiconductor element layer 303 is not irradiated with the laser beam 313, and damage to the semiconductor element layer 303 can be suppressed.

Note that when the sealing layer 305 over the conductive resin 304 is irradiated with the laser beam 313, the sealing layer 305 may not be completely removed, and the fiber body 113 may remain in the opening portion 312. In a later step, a conductive adhesive material 315 is formed in the opening portion 312. Since the fiber body 113 remains in the opening portion 312, the conductive adhesive material 315 is more firmly bonded, and physical strength can be improved. Thus, resistance to bending can be improved.

Next, the sealing layer 305, the semiconductor element layer 303, and the second sealing layer 311 are irradiated with a laser beam, and grooves 314 are formed. The sealing layer 305, the semiconductor element layer 303, and the second sealing layer 311 are divided into chips 321, using the grooves 314 (see FIG. 2C).

In this embodiment mode, the grooves 314 are formed using a UV laser beam as the laser beam. The size of each of the sealing layer 305, the semiconductor element layer 303, and the second sealing layer 311 before the division is 120 mm×100 mm, and the size of the chip 321 formed after the division is 10 mm×10 mm.

Figure 5C:
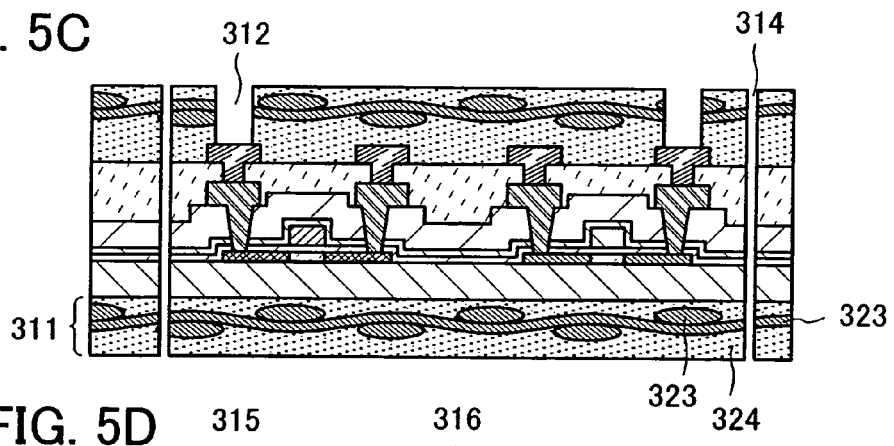

FIG. 5C is a cross-sectional view in the case where the element layer 51 shown in FIG. 3A is used as the semiconductor element layer 303.

Figure 5D:
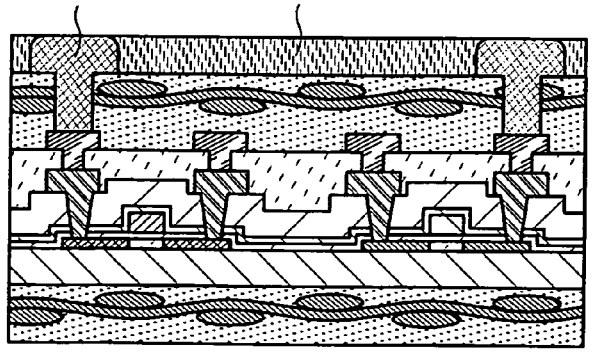

After the division into individual chips 321, the conductive adhesive material 315 which is electrically connected to the conductive resin 304 is formed in the opening portion 312, and an adhesive material 316 is formed on a surface of the sealing layer 305, which is not provided with the conductive adhesive material 315 (see FIG. 5D). In this embodiment mode, a conductive adhesive material containing silver is used as the conductive adhesive material 315. FIG. 5D is a cross-sectional view in the case where the element layer 51 shown in FIG. 3A is used as the semiconductor element layer 303. Note that the second sealing layer 311 includes a fiber body 323 and an organic resin layer 324. For the fiber body 323, the same material as that of the fiber body 113 may be used. For the organic resin layer 324, the same material as that of the organic resin layer 114 may be used.

Figure 2E:
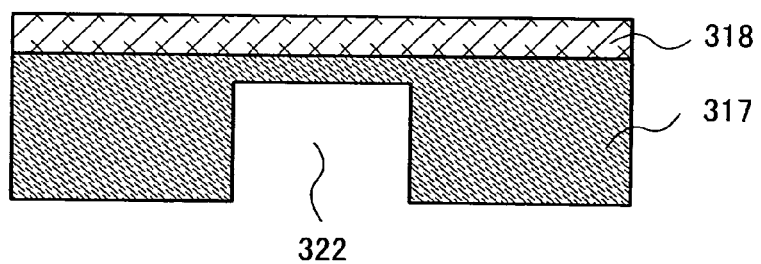

An external antenna 317 is formed on a substrate 318, and a depressed portion 322 is formed in the external antenna 317 (see FIG. 2E).

The antenna 317 is formed in such a manner that droplets or a paste containing at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like is/are discharged onto the substrate 318 by a droplet discharging method (such as an inkjet method or a dispenser method) and then dried and baked. The antenna is formed by a droplet discharging method, whereby the number of steps can be reduced, and accordingly, cost can be reduced.

Alternatively, the antenna 317 may be formed by a screen printing method. When a screen printing method is used, as a material of the antenna 317, a conductive paste in which conductive particles each having a diameter of several nanometers to several tens of micrometers are dissolved or dispersed in an organic resin is selectively printed. As the conductive particle, at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like; fine particles of silver halide; or dispersible nanoparticles can be used. Moreover, for the organic resin included in the conductive paste, one or more of organic resins selected from organic resins which functions as binders, solvents, dispersants, or coating materials of metal particles can be used. Typically, organic resins such as an epoxy resin and a silicone resin can be employed.

Further alternatively, the antenna 317 may be formed by gravure printing other than a screen printing method, or can be formed using a conductive material by a plating method, a sputtering method, or the like.

In this embodiment mode, the antenna 317 is formed by copper plating.

As the substrate 318, a film, paper, or the like may be used, or a sealing layer having the same structure as the sealing layer 305 or the sealing layer 311 may be used. When a film is used, an organic film such as an aramid film, a polyethylene naphthalate (PEN) film, a polyethylene terephthalate (PET) film, or a polyethersulfone (PES) may be used.

Figure 2F:
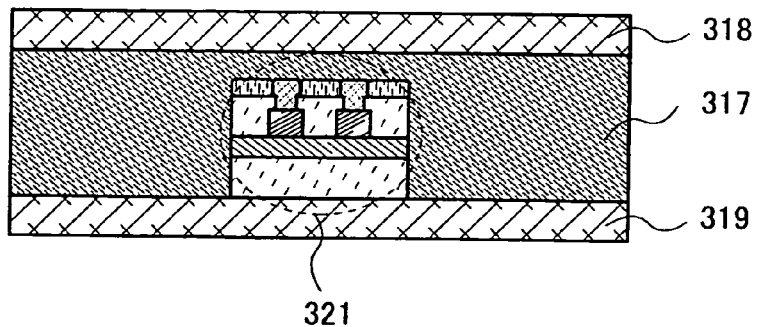

The chip is attached to the depressed portion with the adhesive material 316 (see FIG. 2F). The depth of the depressed portion is made approximately equal to the thickness of the chip 321, whereby the chip 321 is located inside the antenna 317, and a surface of the antenna 317 is planarized. The semiconductor element layer 303 is electrically connected to the antenna 317 through the conductive resin 304 and the conductive adhesive material 315.

Alternatively, the thickness of the chip may be a little larger or smaller than the depth of the depressed portion as long as the chip can withstand external pressure. For example, the thickness of the chip may be larger than the thickness of a substrate 319 to be attached in a later step by one third of the thickness of the substrate 319 or may be smaller than the thickness of the substrate 319 by one third of the thickness of the substrate 319. That is, even when the chip has a thickness that is 4/3 times the thickness of the substrate 319 and protrudes from the depressed portion or when the chip has a thickness that is 2/3 times the thickness of the substrate 319 and does not completely fill the depressed portion, effects of the present invention can be obtained.

As described above, it is needless to say that the effects of the present invention can be obtained when the thickness of the chip is approximately equal to the depth of the depressed portion. Moreover, the effects of the present invention can also be obtained when the thickness of the chip is less than or equal to 4/3 times the thickness of the substrate to be attached or more than or equal to 2/3 times the thickness of the substrate to be attached.

In this embodiment mode, a material which includes a fiber body and an organic resin and has the same structure as the sealing layers 305 and 311 is used for the substrate 318.

Next, the substrate 319 is attached to the sealing layer 311 and the antenna 317 (see FIG. 2F). Note that the substrate 319 is not necessarily provided.

The provision of the substrate 319 can prevent water from entering through a boundary between the substrate 319 and the sealing layer 311, and thus, the reliability is further improved.

Figure 6:
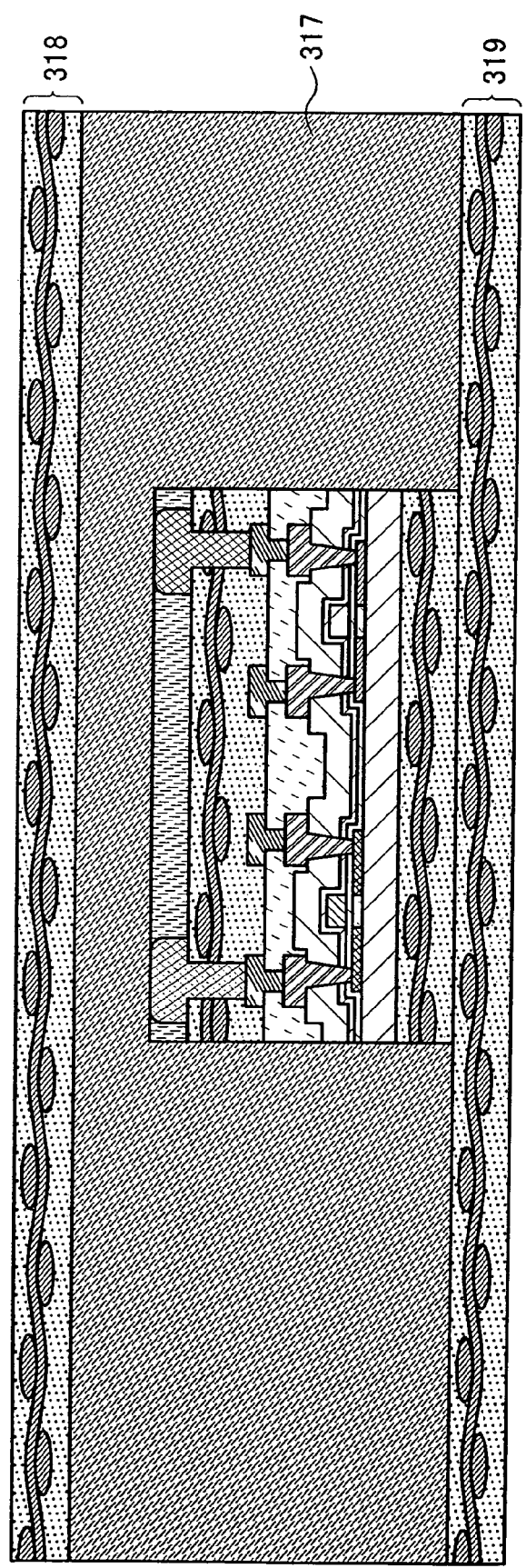
FIG. 6 is a cross-sectional view illustrating a method of manufacturing a semiconductor device of the present invention.

In this embodiment mode, a material having the same structure as the sealing layers 305 and 311 is used for the substrate 319 (see FIG. 6).

As described above, a semiconductor device in this embodiment mode can be obtained. Since the semiconductor device obtained through the steps in this embodiment mode includes a sealing layer in which a fiber body is impregnated with an organic resin, a highly reliable semiconductor device which is not easily damaged by local pressure from the outside can be manufactured with high yield.

In addition, the chip 321 is embedded in the antenna 317 in this embodiment mode, whereby a planarized semiconductor device can be obtained. Thus, creases are prevented from occurring in the sealing layer in which the fiber body is impregnated with the organic resin.

Further, when a protective material such as a film is attached to a surface of a completed semiconductor device, the semiconductor device has to pass over a roller. When passing over the roller in such a manner, the semiconductor device might be destroyed by application of linear pressure. However, the semiconductor device with little unevenness can smoothly pass over the roller, and destruction of the semiconductor device can be prevented.

Embodiment Mode 2

In this embodiment mode, an example in which a sealing layer is formed by a manufacturing method different from that in Embodiment Mode 1 is described with reference to FIGS. 7A to 7D.

First, the manufacturing steps up to and including the step of formation of the conductive resin 304 (see FIGS. 1A and 1B) are performed based on Embodiment Mode 1. Next, the fiber body 113 is provided over the semiconductor element layer 303 (see FIG. 7A).

Then, the organic resin layer 114 is formed over the fiber body 113 and the semiconductor element layer 303. At this time, the fiber body 113 is impregnated with an organic resin in the organic resin layer 114. That is, the fiber body 113 is included in the organic resin layer 114. Accordingly, adhesion between the fiber body 113 and the organic resin layer 114 is increased.

Next, the organic resin layer 114 is heated so that the organic resin in the organic resin layer 114 is plasticized or cured. Note that when the organic resin is an organic plastic resin, the organic resin which is plasticized is then cured by cooling the organic resin to a room temperature. Alternatively, when the organic resin is a UV curable resin, it is cured by UV irradiation.

Figure 7A:
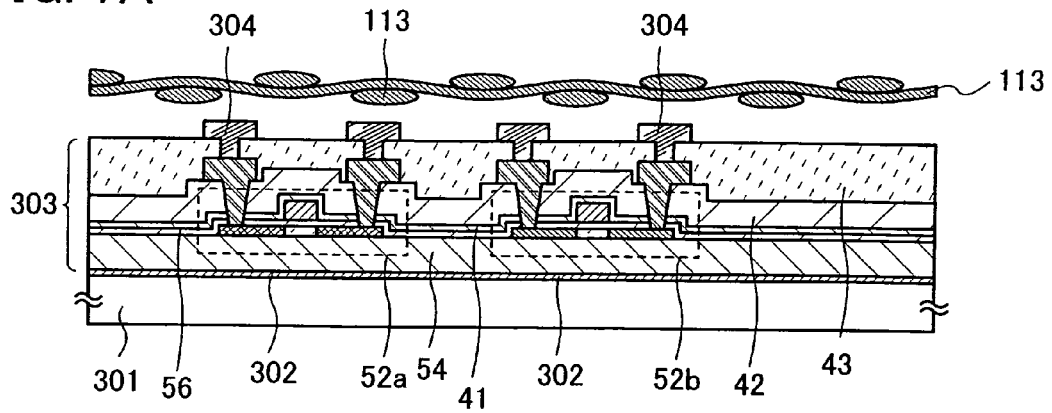
FIGS. 7A to 7D are cross-sectional views illustrating a method of manufacturing a semiconductor device of the present invention.
Figure 7B:
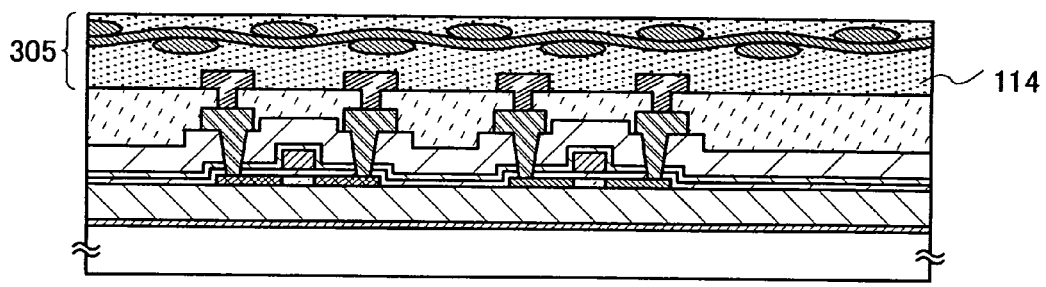
Figure 7C:
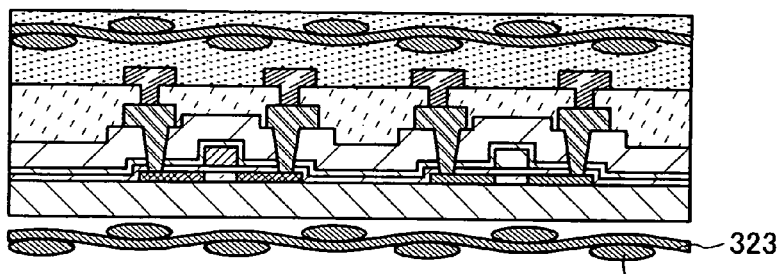
Figure 7D:
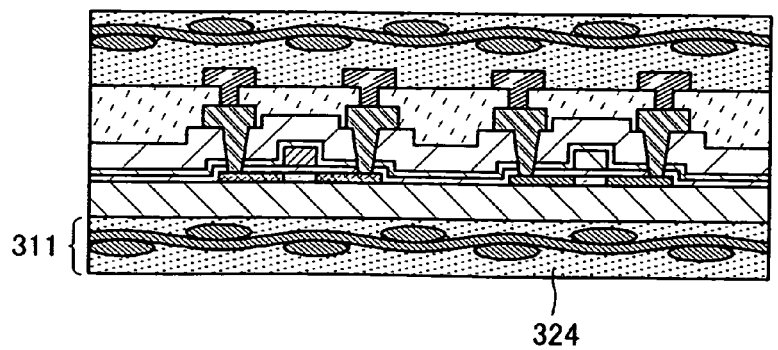

Thus, as shown in FIG. 7B, the organic resin layer 114 which is impregnated into the fiber body 113 and fixed to one surface of the semiconductor element layer 303 is formed. Note that the organic resin layer 114 and the fiber body 113 which are fixed to one surface of the semiconductor element layer 303 serve as the sealing layer 305. Accordingly, a structure similar to that shown in FIG. 1B can be obtained.

Further, the steps in FIGS. 1D and 1E and FIGS. 2A to 2D are performed. Then, in a manner similar to FIGS. 2E and 2F, FIGS. 5C and 5D, and FIG. 6, the depressed portion 322 is formed in the external antenna 317 provided on the substrate 318, the chip 321 is embedded in the depressed portion 322, and the substrate 319 is attached to the sealing layer 311 and the antenna 317. Through the above manufacturing steps, the semiconductor device shown in FIG. 6 can be obtained.

Note that the substrate 319 is not necessarily provided.

In addition, the substrates 318 and 319 may be formed through steps similar to those of the sealing layer 305.

In this embodiment mode, the fiber body 113 or the fiber body 323 is provided on an attachment surface, and the organic resin layer 114 or the organic resin layer 324 is provided therefor. Next, the fiber body 113 or the fiber body 323 is impregnated with an organic resin, and then, the organic resin is cured, whereby the sealing layer 305 or the sealing layer 311 is formed.

In this embodiment mode, the thickness of the organic resin layer 114 or the organic resin layer 324 can be changed, and accordingly, the thickness of the sealing layer 305 or the sealing layer 311 can also be changed. For example, the sealing layers 305 and 311 that are thinner than the sealing layers 305 and 311 in Embodiment Mode 1 can be obtained. Thus, the total thickness of the semiconductor device can be reduced.

Embodiment Mode 3

In this embodiment mode, a semiconductor device having a structure different from the structures in Embodiment Modes 1 and 2 is described with reference to FIGS. 8A and 8B.

Figure 8A:
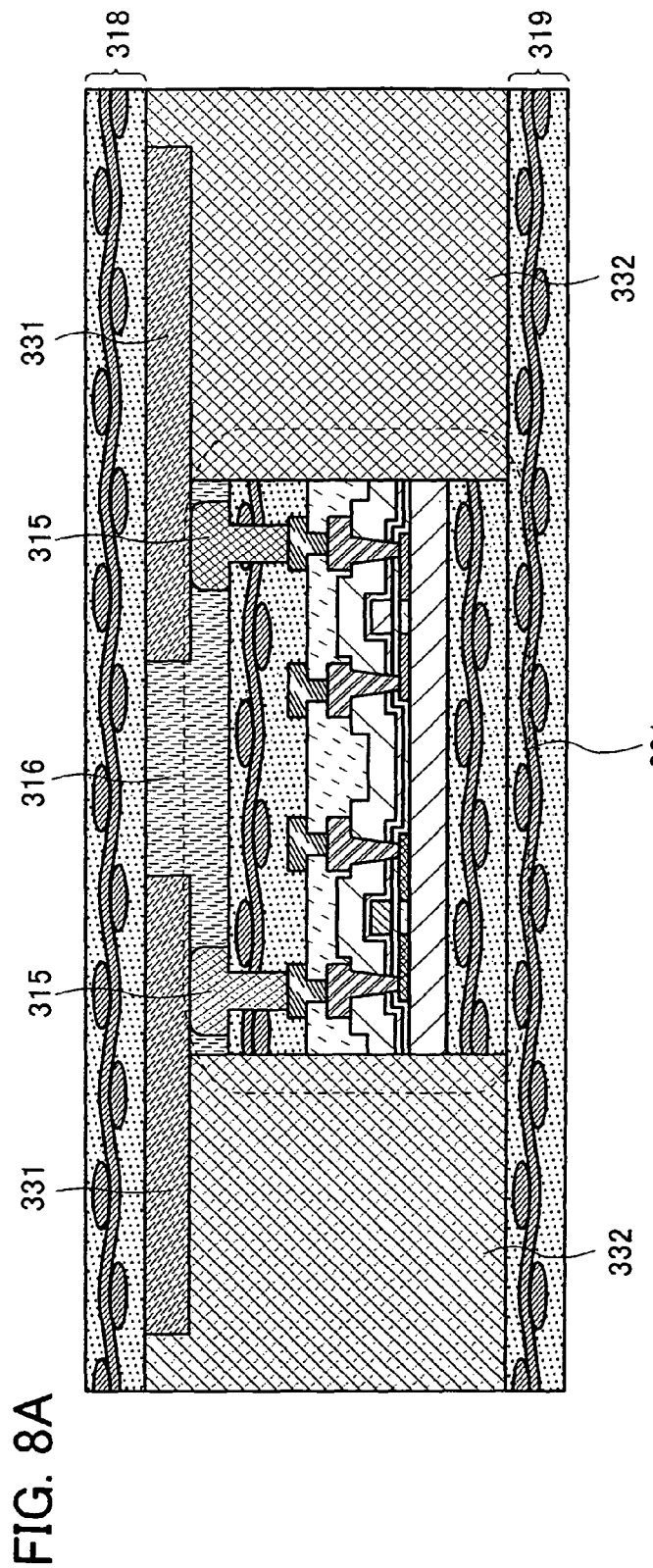
FIG. 8A is a cross-sectional view illustrating a method of manufacturing a semiconductor device of the present invention.
Figure 8B:
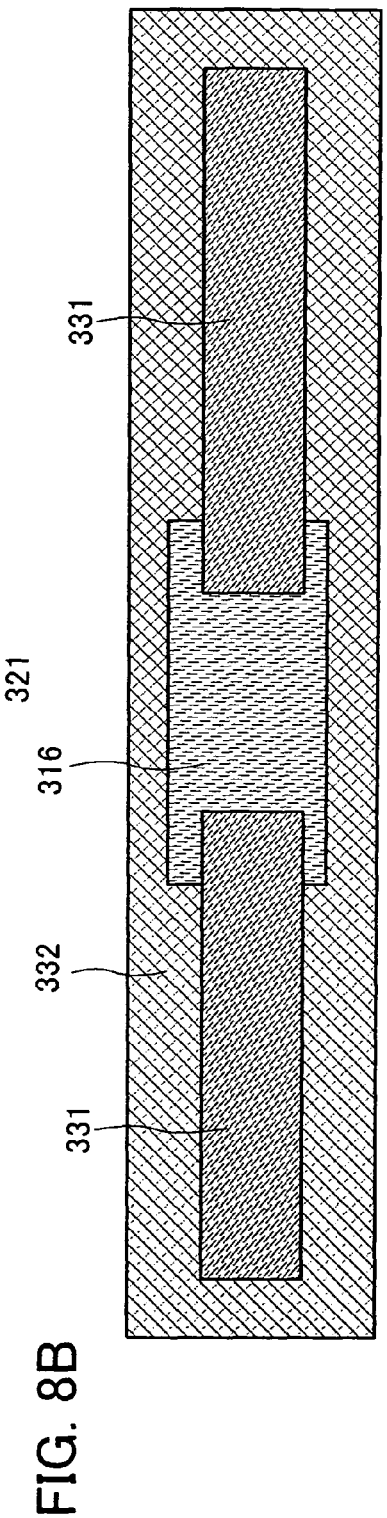
FIG. 8B is a top plan view of FIG. 8A.

FIG. 8A is a cross-sectional view of a semiconductor device in this embodiment mode. FIG. 8B is a top plan view of FIG. 8A. An antenna 331 is provided on the substrate 318, and the chip 321 is attached to the substrate 318 with the adhesive material 316. The conductive adhesive material 315 in the chip 321 is electrically connected to the antenna 331.

The substrate 318, the antenna 331, and the chip 321 are provided with a base material 332 so as to compensate for the thickness of the chip 321. Accordingly, the thickness of the base material 332 is equal to the thickness of the chip 321, and a flat surface is formed. Moreover, the substrate 319 is attached on the flat surface.

According to this embodiment mode, a semiconductor device which has a uniform thickness and a flat surface can be obtained.

Embodiment Mode 4

In this embodiment mode, an application example of a semiconductor device of the present invention is described. In this embodiment mode, an RFID is described as one application example of the semiconductor device.

Figure 9:
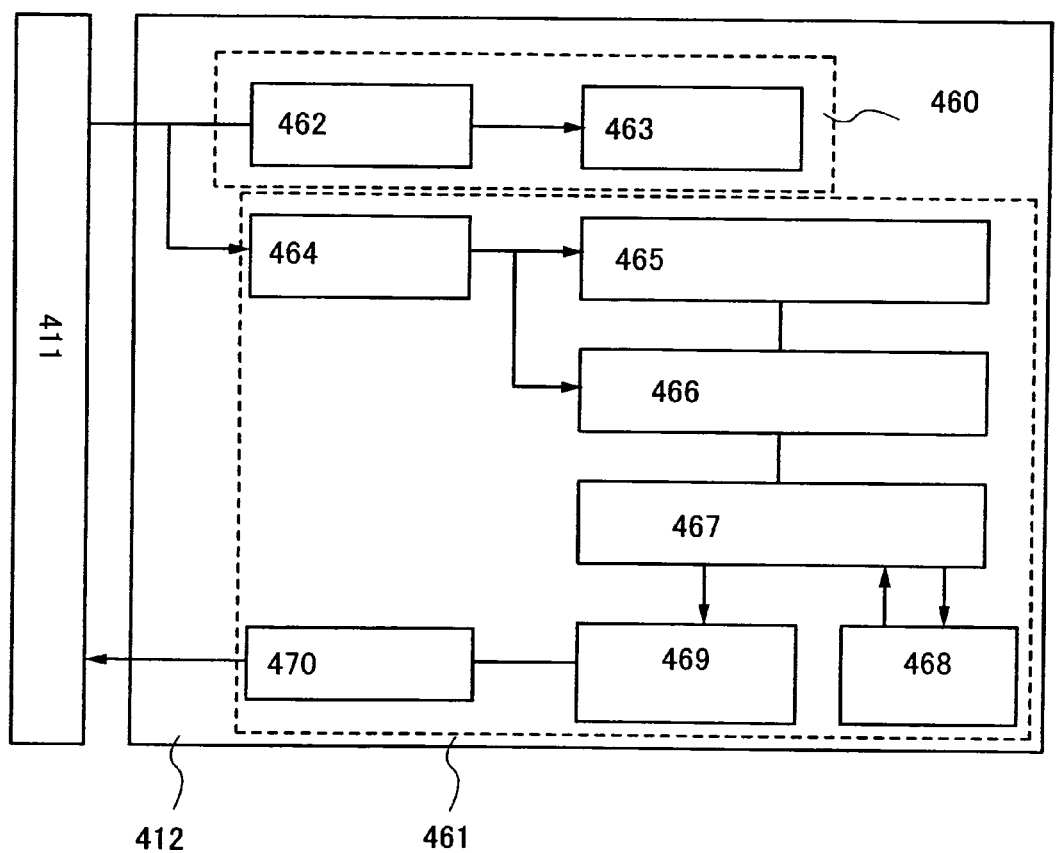
FIG. 9 is a block diagram illustrating an application example of a semiconductor device of the present invention.

First, a circuit structure example of an RFID 501 to which the semiconductor devices of the present invention is applied is described. FIG. 9 is a block circuit diagram of the RFID 501.

The RFID 501 in FIG. 9 conforms to specifications of ISO 15693 of the International Organization for Standardization, and it is a vicinity type and has a communication signal frequency of 13.56 MHz. Moreover, reception only responds to a data reading instruction, a data transmission rate in transmission is approximately 13 kHz, and the Manchester code is used for a data encoding format.

A circuit portion 412 of the RFID 501 is roughly divided into a power supply portion 460 and a signal processing portion 461. The power supply portion 460 includes a rectifier circuit 462 and a storage capacitor 463. Further, the power supply portion 460 may be provided with a protection circuit portion (also referred to as a limiter circuit portion) for protecting the internal circuit when the amount of electric power received by an antenna 411 is too high, and a protection circuit control circuit portion for controlling whether or not to operate the protection circuit portion. The provision of the circuit portions can prevent malfunction caused when a large amount of electric power is received by the RFID under the situation in which a communication range between the RFID and a communication device is extremely short, for example. Thus, the reliability of the RFID can be improved. That is, the RFID can be normally operated without degradation of an element in the RFID or destruction of the RFID itself.

The antenna 411 in FIG. 9 corresponds to the antenna 317 described in Embodiment Modes 1 and 2 and the antenna 331 described in Embodiment Mode 3. Further, the circuit portion 412 is formed in the chip 321.

Note that in this embodiment mode, a communication device may have a means to transmit and receive information to/from the RFID by wireless communication. Examples of the communication device include a reader which reads information; a reader/writer which has a function of reading and a function of writing; and a mobile phone, a computer, and the like which have one of or both the function of reading and the function of writing.

The rectifier circuit 462 rectifies a carrier wave received by the antenna 411 and generates direct-current voltage. The storage capacitor 463 smoothes the direct-current voltage generated in the rectifier circuit 462. The direct-current voltage generated in the power supply portion 460 is supplied to each circuit in the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit which demodulates a signal received by the antenna 411. The received signal which is demodulated by the demodulation circuit 464 is input to the clock generation/correction circuit 465 and the recognition/determination circuit 466.

The clock generation/correction circuit 465 generates a clock signal which is necessary for operating the signal processing portion 461, and also has a function of correcting the clock signal. For example, the clock generation/correction circuit 465 includes a voltage controlled oscillator circuit (hereinafter referred to as a VCO circuit), uses an output of the VCO circuit as a feedback signal, compares phases between a supplied signal and the feedback signal, and adjusts an output signal by negative feedback so that the signal to be input and the feedback signal have a certain phase.

The recognition/determination circuit 466 recognizes and determines an instruction code. The instruction code recognized and determined by the recognition/determination circuit 466 is an end-of-frame (EOF) signal, a start-of-frame (SOF) signal, a flag, a command code, a mask length, a mask value, or the like. Moreover, the recognition/determination circuit 466 has a cyclic redundancy check (CRC) function that identifies a transmission error.

The memory controller 467 reads data from the mask ROM 468 in response to a signal processed by the recognition/determination circuit 466. An ID or the like is stored in the mask ROM 468. The mask ROM 468 is mounted on the RFID 501, whereby the read-only RFID 501 in which data is incapable of being replicated or altered is formed. When the read-only RFID 501 is embedded in paper, forgery prevention paper can be provided.

The encoding circuit 469 encodes the data which is read from the mask ROM 468 by the memory controller 467. The encoded data is modulated by the modulation circuit 470. The data modulated by the modulation circuit 470 is transmitted from the antenna 411 as a carrier wave.

Next, usage examples of an RFID are described. An RFID of the present invention can be used for a variety of paper media and film media. In particular, the RFID of the present invention can be used for a variety of paper media for which forgery prevention is necessary. Examples of the paper media include banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, and deeds of mortgage.

Further, by implementation of the present invention, a lot more information than that which is visually shown on a paper medium can be held in the paper medium or the film medium. Accordingly, when the RFID of the present invention is applied to a product label or the like, development of an electronic system for merchandise management or prevention of product theft can be realized. Usage examples of the paper according to the present invention are described below with reference to FIGS. 10A to 10E.

Figure 10A:
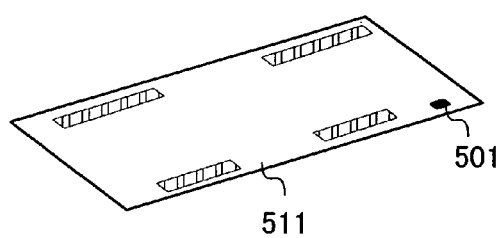
FIGS. 10A to 10E each illustrate an application example of a semiconductor device of the present invention.
Figure 10B:
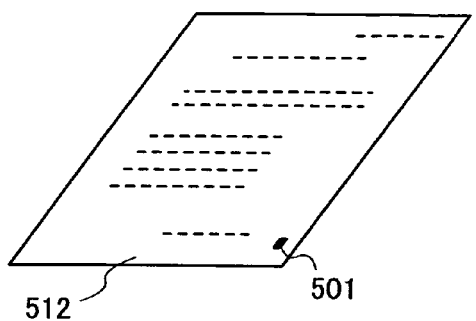

FIG. 10A illustrates an example of a bearer bond 511 including paper embedded with the RFID 501 of the present invention. The bearer bond 511 includes, but is not limited to, a stamp, a ticket, an admission ticket, a gift certificate, a book coupon, a stationery coupon, a beer coupon, a rice coupon, a variety of gift coupons, and a variety of service coupons in its category. Further, FIG. 10B illustrates an example of a certificate 512 (e.g., a residence certificate or a family register) including the paper embedded with the RFID 501 of the present invention.

Figure 10C:
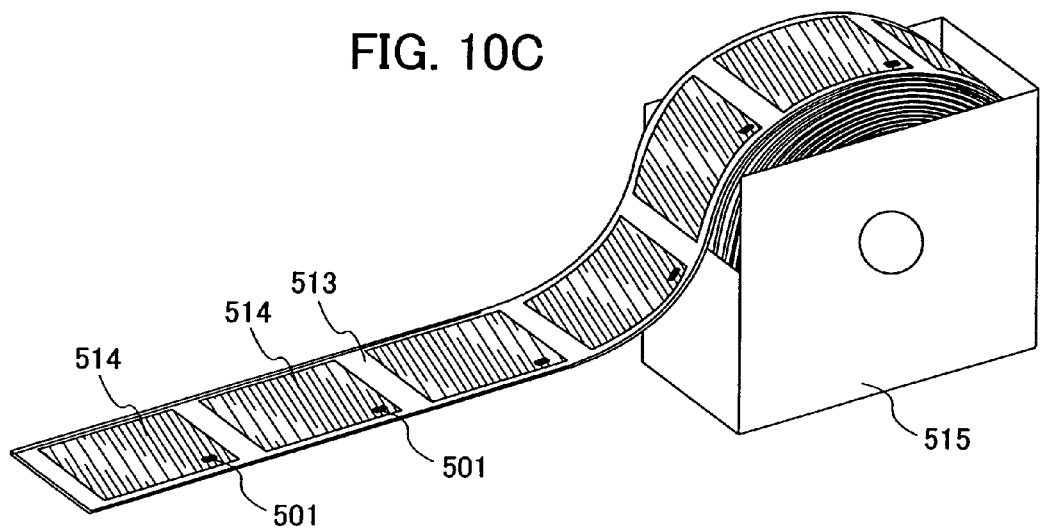

FIG. 10C illustrates an example in which the RFID of the present invention is applied to a label. Over a label base (separate paper) 513, a label (an ID sticker) 514 is formed using the paper embedded with the RFID 501. The label 514 is stored in a box 515. On the label 514, information regarding a product or a service (such as product name, brand, trademark, trademark owner, seller, or manufacturer) is printed. Moreover, a unique ID number of the product (or a category of the product) is stored in the RFID 501, whereby forgery, infringement of intellectual property rights such as a trademark right or a patent right, and illegal activity such as unfair competition can be spotted easily. The RFID 501 can be input with a large amount of information that cannot all be written on a container or a label of the product, such as the product's area of production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication device. Further, the information can easily be rewritten and erased, for example, by a producer, but cannot be rewritten and erased, for example, by the transactor or the consumer.

Figure 10D:
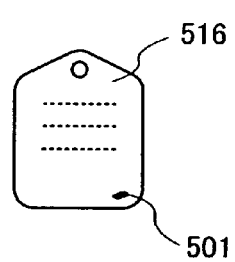
Figure 10E:
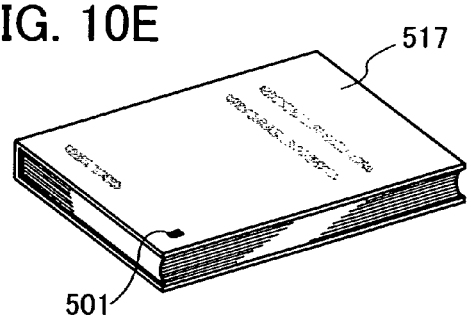

FIG. 10D illustrates a tag 516 formed using paper or a film which is embedded with the RFID 501. The tag 516 is formed using the paper or the film which is embedded with the RFID 501, whereby the tag can be manufactured less expensively than a conventional ID tag using a plastic housing. FIG. 10E illustrates a book 517 in which the RFID of the present invention is used for a cover. The RFID 501 is embedded in the cover.

The label 514 or the tag 516 mounted with the RFID, which is an example of the semiconductor device of the present invention, is attached to the product, whereby merchandise management becomes easy. For example, when the product is stolen, the perpetrator can be spotted quickly by following a route of the product. In such a manner, when the RFID of the present invention is used as an ID tag, historical management of the product's raw material, area of production, manufacturing and processing, distribution, sales, and the like as well as tracking inquiry becomes possible. That is, the product can be traceable. Moreover, by the present invention, a tracing management system of the product can be introduced at lower cost than before.

The RFID, which is an example of the semiconductor device of the present invention, is not easily damaged by local pressing force. Accordingly, a paper medium and a film medium each including the RFID, which is an example of the semiconductor device of the present invention, can be bent in processing of attachment, setting, or the like, leading to improvement in treatment efficiency. Further, since information can be written with a writing material to a paper medium and a film medium each including the RFID, which is an example of the semiconductor device of the present invention, the range of uses is expanded.

Embodiment Mode 5

In this embodiment mode, an electronic device provided with the RFID in Embodiment Mode 4 is described below.

Examples of electronic devices provided with the RFID in Embodiment Mode 4 include cameras such as video cameras and digital cameras, goggle displays (head mounted displays), navigation systems, audio reproducing devices (e.g., car audio and audio component sets), computers, game machines, portable information terminals (e.g., mobile computers, mobile phones, portable game machines, and e-book readers), and image reproducing devices provided with storage media (specifically, a device for reproducing the content of a storage medium such as a DVD (digital versatile disc) and having a display for displaying the reproduced image). FIGS. 11A to 11E illustrate specific examples of such electronic devices.

Figure 11A:
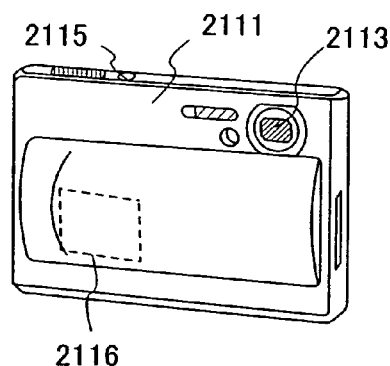
FIGS. 11A to 11E each illustrate an electronic device to which a semiconductor device of the present invention can be applied.
Figure 11B:
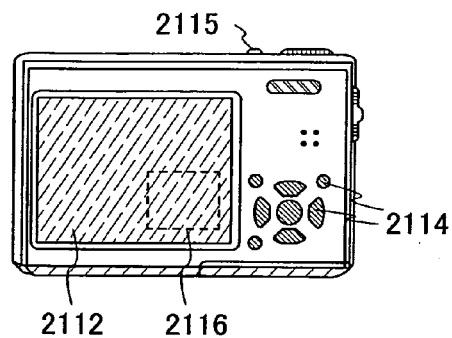

FIGS. 11A and 11B illustrate a digital camera. FIG. 11B illustrates the rear side of the digital camera in FIG. 11A. The digital camera includes a housing 2111, a display portion 2112, a lens 2113, operating keys 2114, a shutter button 2115, and the like. A semiconductor device 2116 of the present invention, which has a function as a memory device, an MPU, an image sensor, or the like, is provided inside the housing 2111.

Figure 11C:
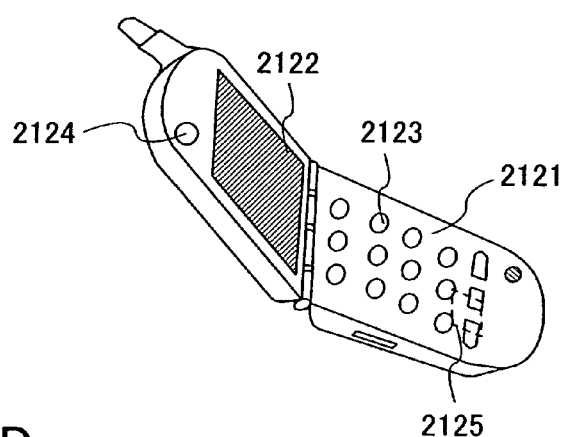

FIG. 11C illustrates a mobile phone, which is one typical example of portable terminals. The mobile phone includes a housing 2121, a display portion 2122, operating keys 2123, an optical sensor 2124, and the like. A semiconductor device 2125 of the present invention, which has a function as a memory device, an MPU, an image sensor, or the like, is provided inside the mobile phone.

Figure 11D:
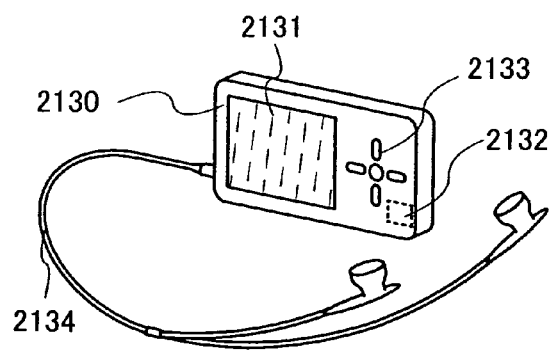

FIG. 11D illustrates a digital player, which is one typical example of audio devices. The digital player shown in FIG. 11D includes a main body 2130, a display portion 2131, a semiconductor device 2132 of the present invention, which has a function as a memory device, an MPU, an image sensor, or the like, an operation portion 2133, earphones 2134, and the like.

Figure 11E:
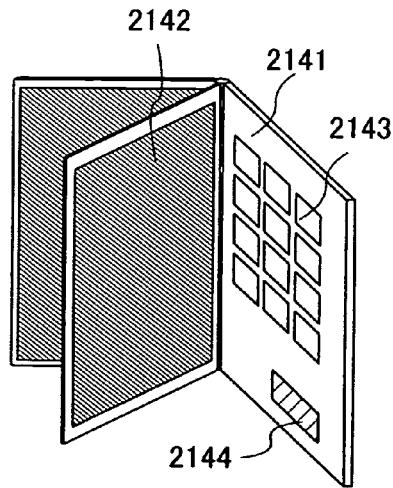

FIG. 11E illustrates an e-book reader (also referred to as electronic paper). The e-book reader includes a main body 2141, a display portion 2142, operating keys 2143, and a semiconductor device 2144 of the present invention, which has a function as a memory device, an MPU, an image sensor, or the like. Further, a modem may be incorporated in the main body 2141, or a structure capable of wirelessly transmitting and receiving information may be employed.

As described above, the applicable range of the semiconductor device of the present invention is so wide that the semiconductor device can be applied to other electronic devices.

This application is based on Japanese Patent Application serial No. 2007-223342 filed with Japan Patent Office on Aug. 30, 2007, the entire contents of which are hereby incorporated by reference.

What is claimed is:

1. A semiconductor device comprising:
   a chip comprising:
      a semiconductor element layer comprising a thin film transistor;
      a conductive resin over the semiconductor element layer; and
      a sealing layer covering the semiconductor element layer and the conductive resin, comprising a fiber body impregnated with an organic resin; and
   an antenna having a depressed portion, electrically connected to the thin film transistor through the conductive resin,
   wherein the chip is embedded inside the depressed portion,
   wherein the sealing layer has a thickness of 10 to 100 μm, and wherein a thickness of the chip is equal to or smaller than a depth of the depressed portion.

2. A semiconductor device according to claim 1, wherein the fiber body is a woven fabric.

3. A semiconductor device according to claim 2, wherein the woven fabric comprises warp yarns and weft yarns, and
wherein at least one yarn of the warp yarns and the weft yarns is a bundled single yarn of an organic compound or an inorganic compound.

4. A semiconductor device according to claim 1, wherein the fiber body is a nonwoven fabric.

5. A semiconductor device according to claim 1, wherein the fiber body includes at least one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

6. A semiconductor device according to claim 1, wherein the organic resin includes at least one of a thermosetting resin, a thermoplastic resin, and a UV curable resin.

7. A semiconductor device according to claim 6, wherein the thermosetting resin is one selected from the group consisting of an epoxy resin, an unsaturated polyester resin, a polyimide resin, a bismaleimide-triazine resin, and a cyanate resin.

8. A semiconductor device according to claim 6, wherein the thermoplastic resin is one selected from the group consisting of a polyphenylene oxide resin, a polyetherimide resin, and a fluorine resin.

9. A semiconductor device according to claim 1, wherein the antenna includes at least one of silver, gold, copper, nickel, platinum, palladium, tantalum, molybdenum, titanium, and aluminum.

10. A semiconductor device according to claim 6, wherein the antenna includes at least one of silver, gold, copper, nickel, platinum, palladium, tantalum, molybdenum, titanium, and aluminum.

11. A semiconductor device comprising:
a chip comprising:
  a semiconductor element layer comprising a thin film transistor;
  a conductive resin over the semiconductor element layer; and
  a sealing layer covering the semiconductor element layer and the conductive resin, comprising a fiber body impregnated with an organic resin; and
an antenna having a depressed portion, electrically connected to the thin film transistor through the conductive resin; and
a substrate provided to cover the chip and the antenna,
wherein the chip is embedded inside the depressed portion, and is located between the antenna and substrate,
wherein the sealing layer has a thickness of 10 to 100 μm,
wherein a thickness of the chip is ⅔ to ⅘ times a thickness of the substrate.

12. A semiconductor device according to claim 11, wherein the fiber body is a woven fabric.

13. A semiconductor device according to claim 12, wherein the woven fabric comprises warp yarns and weft yarns, and
wherein at least one yarn of the warp yarns and the weft yarns is a bundled single yarn of an organic compound or an inorganic compound.

14. A semiconductor device according to claim 11, wherein the fiber body is a nonwoven fabric.

15. A semiconductor device according to claim 11, wherein the fiber body includes at least one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

16. A semiconductor device according to claim 11, wherein the organic resin includes at least one of a thermosetting resin, a thermoplastic resin, and a UV curable resin.

17. A semiconductor device according to claim 16, wherein the thermosetting resin is one selected from the group consisting of an epoxy resin, an unsaturated polyester resin, a polyimide resin, a bismaleimide-triazine resin, and a cyanate resin.

18. A semiconductor device according to claim 16, wherein the thermoplastic resin is one selected from the group consisting of a polyphenylene oxide resin, a polyetherimide resin, and a fluorine resin.

19. A semiconductor device according to claim 11, wherein the antenna includes at least one of silver, gold, copper, nickel, platinum, palladium, tantalum, molybdenum, titanium, and aluminum.

20. A semiconductor device according to claim 16, wherein the antenna includes at least one of silver, gold, copper, nickel, platinum, palladium, tantalum, molybdenum, titanium, and aluminum.

21. A semiconductor device comprising:
a chip comprising:
  a semiconductor element layer comprising a thin film transistor;
  a conductive resin over the semiconductor element layer; and
an antenna having a depressed portion, electrically connected to the thin film transistor through the conductive resin,
wherein the chip is embedded inside the depressed portion,
wherein a thickness of the chip is equal to or smaller than a depth of the depressed portion.

22. A semiconductor device comprising:
a chip comprising:
  a semiconductor element layer comprising a thin film transistor;
  a conductive resin over the semiconductor element layer; and
an antenna having a depressed portion, electrically connected to the thin film transistor through the conductive resin; and
a substrate provided to cover the chip and the antenna,
wherein the chip is embedded inside the depressed portion, and is located between the antenna and substrate,
wherein a thickness of the chip is ⅔ to ⅘ times a thickness of the substrate.

* * * * *